United States Patent
Shih et al.

(10) Patent No.: US 7,612,451 B2
(45) Date of Patent: Nov. 3, 2009

(54) REDUCING RESISTIVITY IN INTERCONNECT STRUCTURES BY FORMING AN INTER-LAYER

(75) Inventors: Chih-Chao Shih, Hsinchu (TW); Cheng-Lin Huang, Hsinchu (TW); Ching-Hua Hsieh, Hsinchu (TW); Shau-Lin Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 182 days.

(21) Appl. No.: 11/486,893

(22) Filed: Jul. 13, 2006

(65) Prior Publication Data

US 2008/0012133 A1   Jan. 17, 2008

(51) Int. Cl.
*H01L 23/48* (2006.01)
*H01L 23/52* (2006.01)
*H01L 29/40* (2006.01)

(52) U.S. Cl. .................. 257/751; 257/774; 257/E23.145
(58) Field of Classification Search ........................ None
See application file for complete search history.

(56) References Cited

U.S. PATENT DOCUMENTS

| | | | |
|---|---|---|---|
| 5,130,274 A | 7/1992 | Harper et al. | |
| 5,659,201 A | 8/1997 | Wollesen | |
| 6,211,075 B1 | 4/2001 | Liu et al. | |
| 6,420,189 B1 | 7/2002 | Lopatin | |
| 6,433,379 B1 * | 8/2002 | Lopatin et al. | 257/301 |
| 6,465,867 B1 | 10/2002 | Bernard et al. | |
| 6,589,329 B1 | 7/2003 | Baum et al. | |
| 6,713,373 B1 * | 3/2004 | Omstead | 438/608 |
| 6,846,739 B1 | 1/2005 | Cathey et al. | |
| 6,936,535 B2 | 8/2005 | Kim et al. | |
| 6,951,812 B2 | 10/2005 | Jiang et al. | |
| 2002/0024139 A1 | 2/2002 | Chan et al. | |
| 2003/0183940 A1 | 10/2003 | Noguchi et al. | |
| 2007/0161128 A1 | 7/2007 | Ueno | |

OTHER PUBLICATIONS

Prater, W. L., "Reduction of Resistivity in Cu Thin Films by Partial Oxidation: Microstructural Mechanisms," Applied Physics Letters, vol. 84, No. 14, Apr. 5, 2004, pp. 2518-2520.

* cited by examiner

*Primary Examiner*—Sue Purvis
*Assistant Examiner*—Ben P Sandvik
(74) *Attorney, Agent, or Firm*—Slater & Matsil, L.L.P.

(57) ABSTRACT

An integrated circuit structure having improved resistivity and a method for forming the same are provided. The integrated circuit structure includes a dielectric layer, an opening in the dielectric layer, and a damascene structure in the opening. The damascene structure includes a metallic barrier layer in the opening and in physical contact with the dielectric layer, a conductive material filling the remaining part of the opening, and an interlayer between and adjoining the metallic barrier layer and the conductive material. The interlayer is preferably a metal compound layer.

15 Claims, 4 Drawing Sheets

REDUCING RESISTIVITY IN INTERCONNECT STRUCTURES BY FORMING AN INTER-LAYER

CROSS-REFERENCE TO RELATED APPLICATION

This application relates to the following commonly assigned, co-pending U.S. patent application: patent application Ser. No. 11/429,879, filed on May 8, 2006, and entitled "Reducing Resistivity in Interconnect Structures of Integrated Circuits," which application is incorporated herein by reference.

TECHNICAL FIELD

This invention relates generally to integrated circuits, and more particularly to the structure and formation methods of interconnect structures of integrated circuits.

BACKGROUND

In the manufacture of integrated circuits, after individual devices such as transistors have been fabricated on the semiconductor substrate, they must be interconnected in order to perform the desired circuit functions. This interconnection process is generally called "metallization" and is performed using a number of different photolithographic, deposition, and removal techniques.

A commonly used process for forming interconnect structures is referred to as a "damascene" process. In a typical damascene process, dielectric layers are deposited over the devices, followed by the formation of openings in the dielectric layers. Conductive materials are then deposited in the openings. A polish process is used to planarize the conductive materials with the surfaces of the respective dielectric layers so as to cause the conductive materials to be "inlaid" in the respective dielectric layers.

Copper is typically used for the damascene processes. Copper has low resistivity, thus the RC delay caused by the resistance in the interconnect structure is low. However, with the scaling of integrated circuits, the dimensions of copper interconnects are also down-scaled. When the dimensions of the copper interconnects approach the mean free path of electrons, the resistivity of the interconnect structure significantly increases. As a result, the RC delay from the interconnect structure significantly increases.

Various methods have been explored to reduce the resistivities of the interconnect structures. For example, diffusion barrier layers, which are used to prevent copper from diffusing into neighboring low-k dielectric layers, typically have high resistivities. Methods for forming thinner barrier layers are thus used. Also, the scattering of electrons at the boundaries of the copper grains contributes to the increase of the resistivity, and thus various methods have been proposed to increase the copper grain size, hence reducing the scattering of electrons at the grain boundaries.

With the constant reduction in the size of interconnect structures, methods for lowering resistivity are always demanded. Particularly, as the dimensions of interconnect structures become smaller and smaller, phenomena that used to be insignificant begin to contribute more to the overall resistivity. Accordingly, new methods adjusting to these factors are needed.

SUMMARY OF THE INVENTION

In accordance with one aspect of the present invention, an integrated circuit structure includes a dielectric layer, an opening in the dielectric layer, and a damascene structure in the opening. The damascene structure includes a metallic barrier layer in the opening and in physical contact with the dielectric layer, a conductive material filling the remaining part of the opening, and an interlayer between the metallic barrier layer and the conductive material and adjoining the conductive material.

In accordance with another aspect of the present invention, an integrated circuit structure includes a dielectric layer, an opening in the dielectric layer extending from a top surface to a bottom surface of the dielectric layer, a metallic barrier layer in the opening and in contact with the dielectric layer, an oxide-based interlayer over the metallic layer, and a conductive material comprising copper on the oxide-based interlayer and filling the opening.

In accordance with yet another aspect of the present invention, a method for forming an integrated circuit structure includes providing a dielectric layer, forming an opening in the dielectric layer, forming a metallic barrier layer in the opening, providing a substantially smooth surface, and filling a conductive material in the opening to form an interconnection. The conductive material is formed on the substantially smooth surface.

In accordance with yet another aspect of the present invention, a method for forming an integrated circuit structure includes providing a dielectric layer, forming an opening in the dielectric layer, forming a first barrier layer in the opening, forming a second barrier layer on the first barrier layer, removing the second barrier layer, and filling a conductive material comprising copper in the opening. The second barrier layer is a metal compound layer.

The advantageous features of the present invention include improved resistivity of interconnect structures of the integrated circuit and full compatibility with existing integrated circuit fabrication processes.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
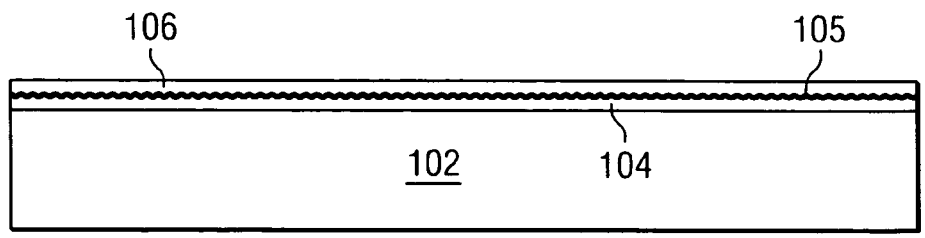
FIG. 1 illustrates a cross-sectional view of a sample used for measuring the effects of surface roughness on resistivity.

Damascene interconnect structures typically use copper for its good conductance. When the dimensions of interconnect structures are scaled down to nano-meter range, surface scattering, which indicates how electrons are reflected on the surface (interface) of copper features, begins to play a more significant role. Research has been performed to evaluate the effect of surface scattering. FIG. 1 illustrates a layered structure comprising a dielectric layer 102, a tantalum layer 104 and a copper layer 106. Table 1 lists three samples having a different roughness at the interface 105, which is located between copper layer 106 and tantalum layer 104.

TABLE 1

|  | Cu/Ta interface roughness (nm) | Resistivity (µohm * cm) |
| --- | --- | --- |
| Sample 1 | 0.383 | 3.43 |
| Sample 2 | 0.505 | 3.66 |
| Sample 3 | 0.947 | 3.80 |

Samples 1, 2 and 3 have substantially similar dimensions. However, the surface roughness at the interface 105 is different for each. It is noted that the resistivity of copper increases with the increase of the roughness at the interface 105. When the roughness increases from about 0.383 nm to about 0.947 nm, the resistivity increases from about 3.43 µohm*cm to about 3.8 µohm*cm. A possible explanation can be found in the Fuchs-Sondheimer and the Dingle theories, which propose that the surface-scattering-induced resistivity in a copper film/wire is affected by its electron scattering behavior. A smooth surface improves the surface scattering behavior by reducing the carrier mobility loss during the surface scattering, hence the surface-scattering-induced resistivity of the copper film/wire is reduced. Accordingly, the total resistivity of the copper film/wire is reduced.

Based on the above perception, an interconnect structure having reduced interface roughness is provided. The intermediate stages of manufacturing a preferred embodiment of the present invention are illustrated. Variations of the preferred embodiments are also discussed. Throughout the various views and illustrative embodiments of the present invention, like reference numbers are used to designate like elements.

Figure 2:
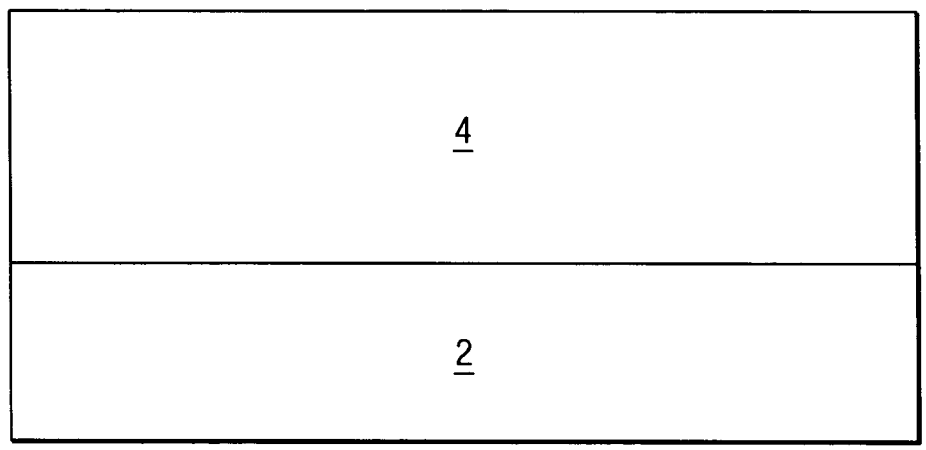
FIGS. 2 through 9 are cross-sectional views of intermediate stages in the manufacture of a preferred embodiment.

A dual damascene process is described for the discussion of the preferred embodiment. FIG. 2 shows the formation of a dielectric layer 2, also referred to as a via inter-metal dielectric (IMD) layer 2. Via IMD layer 2 is formed over a substrate (not shown), which has semiconductor devices (not shown) formed thereon. Via IMD layer 2 preferably has a low dielectric constant (k value), preferably less than about 3.0. The preferred materials include carbon-doped silicon oxide, fluorine-doped silicon oxide, organic low-k material and porous low-k material, and the like. Via IMD layer 2 may be formed using methods such as spin-on, chemical vapor deposition (CVD), etc.

Optionally, an etch stop layer (not shown) may be formed on via IMD layer 2. It may be formed by deposition or by treating the via IMD layer 2 using methods such as plasma treatment.

A trench IMD layer 4 is then formed on via IMD layer 2. Trench IMD layer 4 is preferably formed of a low-k dielectric material with a dielectric constant value (k value) of less than about 3.0. The preferred methods for forming trench IMD layer 4 include spin-on, chemical vapor deposition (CVD), and other known methods. In the preferred embodiment, trench IMD layer 4 and via IMD layer 2 have different etching characteristics, so that via IMD layer 2 can be used as an etch stop layer when the overlying trench IMD layer 4 is etched.

Figure 3:
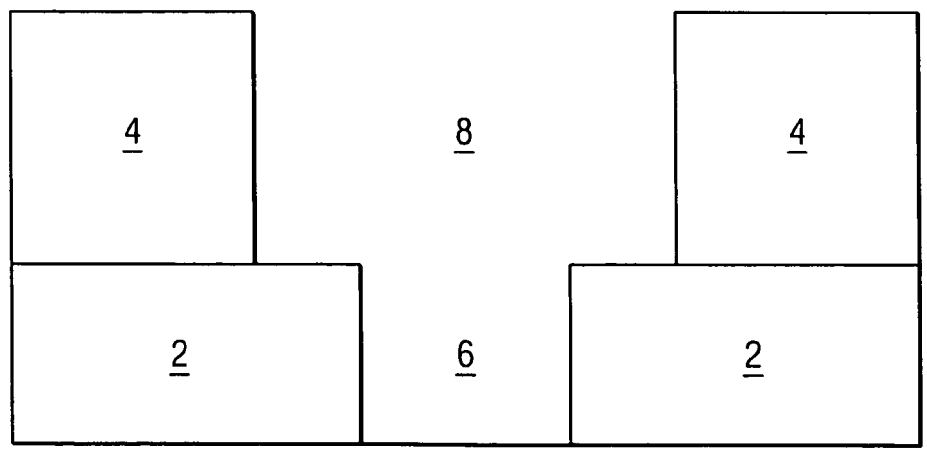

FIG. 3 illustrates the formation of a via opening 6 and a trench opening 8. For forming the openings, a photo resist (not shown) is formed and patterned over the trench IMD layer 4. An anisotropic etching, for example, using fluorine-containing etching gases, cuts through the trench IMD layer 4 and via IMD layer 2, thus forming a via opening 6. In a typical interconnect structure, there will be a conductive material (not shown) underlying via opening 6, thus process control and end-point detection need to be closely controlled, so that the likelihood of over-etching the underlying conductive material is limited.

Trench opening 8 is then formed, preferably by anisotropically etching trench IMD layer 4. Since via IMD layer 2 and trench IMD layer 4 have different etching characteristics, via IMD layer 2 acts as an etch stop layer, preventing the trench opening 8 from extending into via IMD layer 2. In an alternative embodiment wherein an etch stop layer is formed, the etch stop layer is used to stop the etching of the trench opening 8. In yet other embodiments, via IMD 2 layer and trench IMD layer 4 form a single continuous layer, and the depth of the trench opening 8 is adjusted by controlling the etching time.

Figure 4:
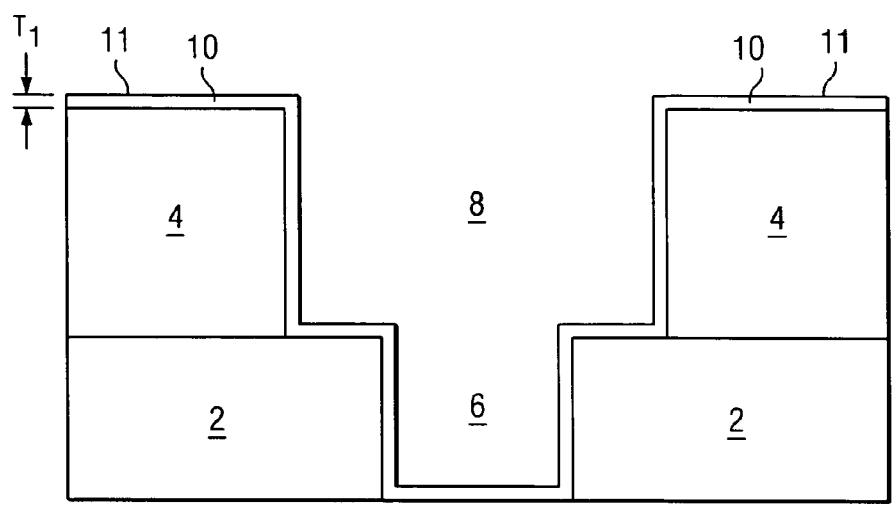

FIG. 4 illustrates the formation of a first barrier layer 10 in openings 6 and 8 and over trench IMD layer 4. In the preferred embodiment, first barrier layer 10 is a metal layer comprising tantalum, titanium, tungsten, ruthenium, and combinations thereof. First barrier layer 10 may be formed using commonly used methods such as physical vapor deposition (PVD), sputtering, chemical vapor deposition (CVD), atomic layer deposition (ALD), and the like. The thickness T1 of first barrier layer 10 is preferably less than about 300 Å. First barrier layer 10 is preferably an amorphous layer.

Figure 5:
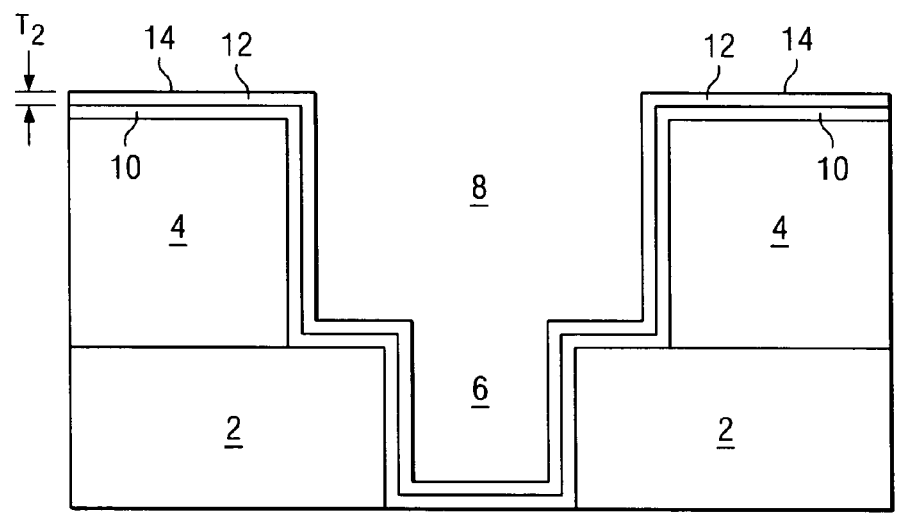

A second barrier layer 12 is then formed on the first barrier layer 10, as shown in FIG. 5. As second barrier layer 12 tends to have a high resistivity, a thin layer helps reduce the resistance of the overall interconnect structure. Preferably, the thickness T2 of second barrier layer 12 is less than about 100 Å, and more preferably between about 5 Å and 30 Å. A ratio of the thickness T2 of second barrier layer 12 to the thickness T1 of first barrier layer 10 is preferably between about 0.1 and about 1.

In the preferred embodiment, second barrier layer 12 is an oxide layer formed by oxidizing the surface of first barrier layer 10 in an oxygen-containing ambient, which preferably includes molecular components such as $O_2$, $N_2O$, $NO_2$, NO, and combinations thereof. In an exemplary embodiment, the oxidation process lasts for at least about one second. Depending on the elements included in first barrier layer 10, the resulting second barrier layer 12 includes tantalum oxide, titanium oxide, tungsten oxide, ruthenium oxide, and combinations thereof. In an exemplary embodiment, second barrier layer 12 comprises tantalum oxide and is formed using air exposure. The preferred process conditions include a chamber pressure of about 1 E-4 torr and process gases containing oxygen. The deposition is preferably performed at a temperature of about 20° C. to about 60° C.

In other embodiments, second barrier layer 12 is a nitride layer formed by nitridating the surface of first barrier layer 10 in a nitrogen-containing ambient, which preferably includes precursors comprising $N_2$, $N_2O$, $NO_2$, $NH_3$, and combinations thereof. In an exemplary embodiment, the oxidation process lasts for at least about one second. Depending on the elements in first barrier layer 10, the resulting second barrier layer 12 includes tantalum nitride, titanium nitride, tungsten nitride, ruthenium nitride, and combinations thereof.

In yet other embodiments, second barrier layer 12 is an oxynitride such as tantalum oxynitride, titanium oxynitride, tungsten oxynitride, and the like. Similarly, second barrier layer 12 is formed by nitridating and oxidizing the surface of first barrier layer 10 in a nitrogen and oxygen containing ambient.

In yet other embodiments, second barrier layer 12 is an oxide, nitride or oxynitride layer deposited on first barrier layer 10. The preferred deposition methods include CVD, ALD, low temperature CVD (LTCVD), low pressure CVD (LPCVD), PVD, sputter, and the like.

In general, second barrier layer 12 comprises a metal compound that can be expressed as MXy, wherein M is a metal selected from tantalum, titanium, tungsten, copper, and combinations thereof, and wherein X is a material selected from carbon, hydrogen, oxygen, nitrogen, sulfur, silicon, and combinations thereof. Y represents a ratio of the number of atoms between X and M. Second barrier layer 12 tends to have a high resistivity and may even be considered an insulating layer if its thickness is substantially greater than the thickness provided in the preferred embodiment of the present invention.

Typically, metal oxides, nitrides, oxynitrides, and/or other compound materials tend to have smoother surfaces than the corresponding metal layers. As a result, surface 14 of second barrier layer 12 tends to have a substantially smaller roughness than surface 11 of first barrier layer 10 (refer to FIG. 4).

Figure 6A:
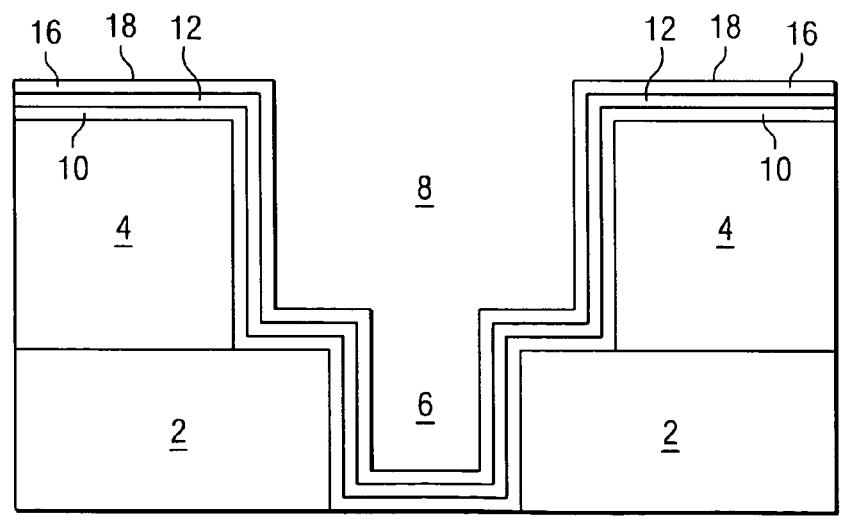

Optionally, as shown in FIG. 6A, a copper oxide layer 16 is formed on second barrier layer 12. Copper oxide layer 16 may be deposited using PVD, CVD, ALD, and the like. Other commonly used methods can also be used. Alternatively, copper oxide layer 16 can be formed by forming a thin copper layer and then oxidizing the thin copper layer. The thickness of the copper oxide layer 16 is preferably less than about 100 Å. Similarly, copper oxide layer 16 has a surface 18, which tends to have a substantially smaller roughness than surface 11 of first barrier layer 10 (refer to FIG. 4).

Figure 6B:
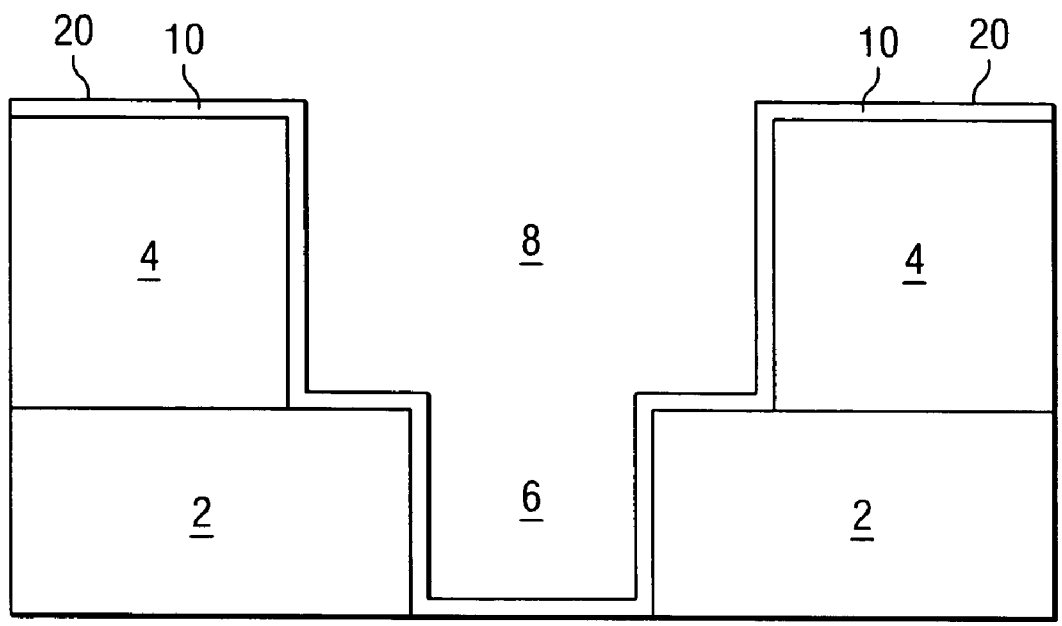
Figure 6C:
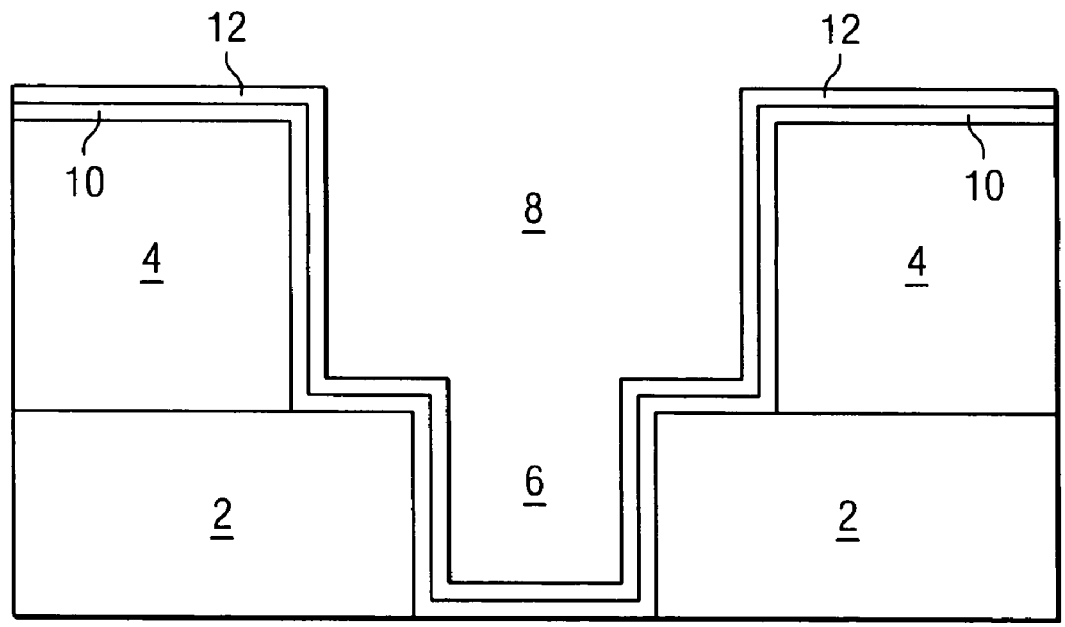

Second barrier layer 12 may optionally be removed after its formation, and the resulting structure is shown in FIG. 6B. FIG. 6B appears to be similar to FIG. 4, however, by performing the processes of forming and removing second barrier layer 12, surface 20 of first barrier layer 10 is substantially smoother than surface 11 in FIG. 4. As is known in the art, second barrier layer 12 may be removed by dry or wet etching. In the case where the conductivity of second barrier layer 12 is too low, second barrier layer 12 may be selectively etched at the bottom of via opening 6, so that first barrier layer 10 is exposed, and the resulting structure is shown in FIG. 6C.

Figure 7:
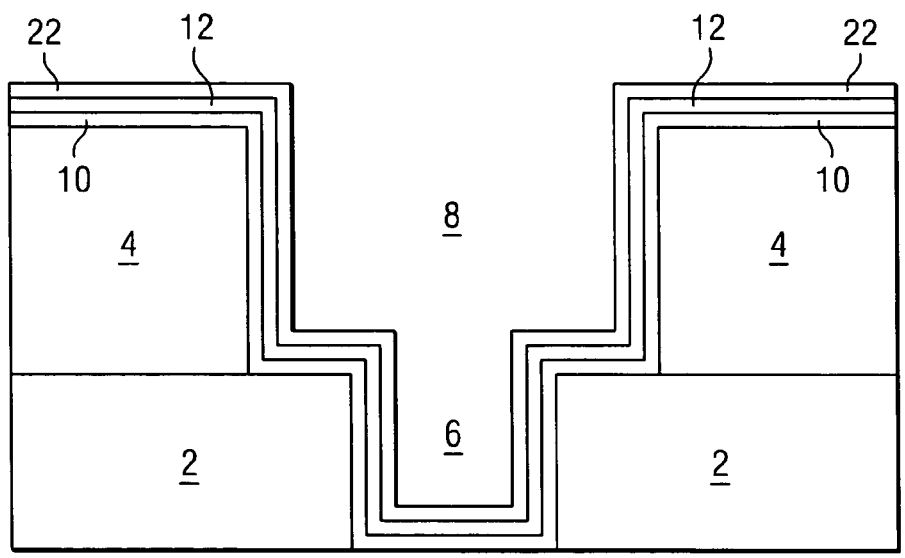

Referring to FIG. 7, a copper seed layer 22 is formed. Depending on the structure formed in the previously discussed steps, copper seed layer 22 may be formed on first barrier layer 10, second barrier layer 12, or copper oxide layer 16. As is known in the art, copper seed layer 22 may be formed by PVD, ALD, CVD, and the like, or other known methods.

Figure 8:
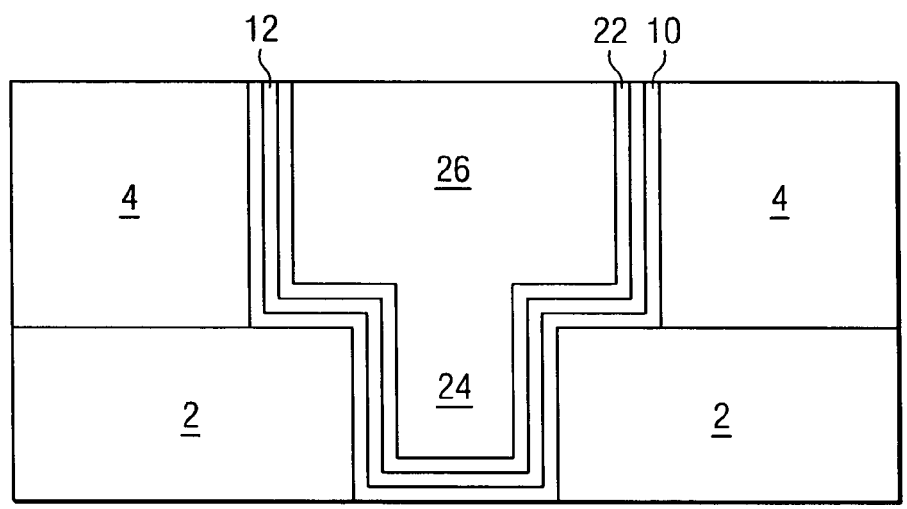

FIG. 8 illustrates the formation of a conductive line 26 and a via 24 in trench opening 8 and via opening 6, respectively. Conductive line 26 and via 24 preferably comprise copper or copper alloys. The preferred formation methods include electro or electroless plating. A chemical mechanical planarization (CMP), also sometimes referred to as a chemical mechanical polish, is then performed to planarize the surface of trench IMD layer 4 and remove excess material.

Figure 9:
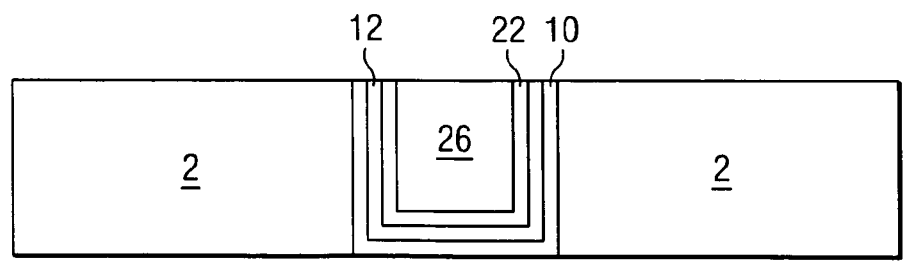

The above-discussed embodiment illustrates a dual damascene process. One skilled in the art will realize that a single damascene process may also be performed using the teaching provided by the preferred embodiment, so as to form a structure as shown in FIG. 9. One skilled in the art will realize the materials and process steps for forming the structure by identifying the reference numerals and comparing them with the previously discussed embodiment.

In the preferred embodiments of the present invention, the interface between metal features 24 and 26 and the underlying layer has a small roughness. The electron scattering at the interface is thus improved with less mobility loss, and the resistivity of the interconnect structure is improved. Referring back to Table 1, the surface roughness of sample 1 is reduced by forming a thin surface tantalum oxide layer, while the surface roughness of sample 2 is not intentionally reduced. Accordingly, the resistivity of sample 1 is lower than that of sample 2 by about six percent. The surface roughness is measured using X-Ray Reflectometry (XRR), which may be performed using Rigaju GXR 300, for example.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
    a dielectric layer;
    an opening in the dielectric layer; and
    a damascene structure in the opening, wherein the damascene structure comprises:
        a metallic barrier layer in the opening and in physical contact with the dielectric layer;
        a conductive material over the metallic barrier layer and filling a remaining part of the opening, wherein a bottom portion of the conductive material comprises a seed layer; and
        an interlayer between and adjoining the metallic barrier layer and the conductive material, wherein the interlayer is a metal compound layer, wherein the interlayer comprises a copper oxide sub-layer and a non-copper oxide layer between the copper oxide sub-layer and the metallic barrier layer, and wherein a first layer over and contacting the metallic barrier layer and a second layer underlying and contacting the conductive material are conductive.

2. The integrated circuit structure of claim 1, wherein the interlayer comprises a material selected from the group consisting essentially of copper oxide, tantalum oxide, titanium oxide, tungsten oxide, ruthenium oxide, and combinations thereof.

3. The integrated circuit structure of claim 1, wherein the interlayer comprises same metals as in the metallic barrier layer.

4. The integrated circuit structure of claim 1, wherein the interlayer has a thickness of less than about 100 Å.

5. The integrated circuit structure of claim 4, wherein the interlayer has a thickness of between about 5 Å and about 30 Å.

6. The integrated circuit structure of claim 1, wherein a thickness of the interlayer to a thickness of the metallic barrier layer has a ratio of between about 0.1 and about 1.

7. The integrated circuit structure of claim 1, wherein the dielectric layer has a dielectric constant value of less than about 3.0.

8. An integrated circuit structure comprising:
a dielectric layer;
an opening in the dielectric layer and extending from a top surface to a bottom surface of the dielectric layer;
a metallic barrier layer in the opening and in contact with the dielectric layer;
an oxide-based interlayer over the metallic barrier layer, wherein the oxide-based interlayer and the metallic barrier layer comprise same metals; and
a conductive material comprising copper on the oxide-based interlayer and filling the opening, wherein a first layer over and contacting the metallic barrier layer and a second layer underlying and contacting the conductive material are conductive.

9. The integrated circuit structure of claim 8, wherein the oxide-based interlayer comprises a material selected from a group consisting essentially of copper oxide, tantalum oxide, titanium oxide, tungsten oxide, ruthenium oxide, copper oxynitride, tantalum oxynitride, titanium oxynitride, tungsten oxynitride, ruthenium oxynitride, and combinations thereof.

10. The integrated circuit structure of claim 8, wherein a thickness of the oxide-based interlayer to a thickness of the metallic barrier layer has a ratio of between about 0.1 and about 1.

11. The integrated circuit structure of claim 8, wherein the oxide-based interlayer comprises a non-copper oxide layer comprising same metals as in the metallic barrier layer, and a copper oxide layer on the non-copper oxide layer.

12. The integrated circuit structure of claim 11, wherein the oxide-based interlayer further comprises at least one non-metal material, and wherein the metallic barrier layer is free from the non-metal material.

13. An integrated circuit structure comprising:
a dielectric layer;
an opening in the dielectric layer and extending from a top surface to a bottom surface of the dielectric layer;
a metallic barrier layer in the opening and in contact with the dielectric layer;
an oxide-based interlayer over the metallic barrier layer, wherein the oxide-based interlayer comprises a non-copper oxide layer comprising same metals as in the metallic barrier layer, and a copper oxide layer on the non-copper oxide layer; and
a conductive material comprising copper on the oxide-based interlayer and filling the opening, wherein a first layer over and contacting the metallic barrier layer and a second layer underlying and contacting the conductive material are conductive.

14. The integrated circuit structure of claim 13, wherein a thickness of the oxide-based interlayer to a thickness of the metallic barrier layer has a ratio of between about 0.1 and about 1.

15. The integrated circuit structure of claim 13, wherein the oxide-based interlayer further comprises at least one non-metal material, and wherein the metallic barrier layer is free from the non-metal material.

* * * * *